(12) United States Patent
Kim et al.

(10) Patent No.: US 7,881,103 B2
(45) Date of Patent: Feb. 1, 2011

(54) PHASE-CHANGE MEMORY DEVICE AND METHOD OF FABRICATING THE SAME

(75) Inventors: Du-eung Kim, Yongin-si (KR); Chang-soo Lee, Yongin-si (KR); Woo-yeong Cho, Suwon-si (KR); Byung-gil Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/574,783

(22) Filed: Oct. 7, 2009

(65) Prior Publication Data

US 2010/0019217 A1      Jan. 28, 2010

Related U.S. Application Data

(63) Continuation of application No. 11/529,323, filed on Sep. 29, 2006, now Pat. No. 7,613,037.

(30) Foreign Application Priority Data

Oct. 18, 2005    (KR) ............................. 20050098191

(51) Int. Cl.
  *G11C 11/00* (2006.01)
(52) U.S. Cl. ........................... 365/163; 365/148; 257/2; 257/3; 977/754

(58) Field of Classification Search .................... 356/46, 356/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 5,296,716 A | * | 3/1994 | Ovshinsky et al. ............. 257/3 |
| 6,579,760 B1 | | 6/2003 | Lung |
| 6,795,338 B2 | * | 9/2004 | Parkinson et al. ........... 365/163 |

FOREIGN PATENT DOCUMENTS

| | | |
|---|---|---|
| KR | 20040083538 | 2/2004 |
| KR | 20040107487 | 12/2004 |

* cited by examiner

*Primary Examiner*—Richard Elms
*Assistant Examiner*—Harry W Byrne
(74) *Attorney, Agent, or Firm*—Volentine & Whitt, PLLC

(57) ABSTRACT

A phase-change memory device includes a semiconductor substrate, a bit line and a word line arranged on the semiconductor substrate to intersect each other, and a phase-change material strip interposed between the bit line and the word line and extending lengthwise in a direction that is substantially parallel to at least a portion of the word line.

20 Claims, 12 Drawing Sheets

PHASE-CHANGE MEMORY DEVICE AND METHOD OF FABRICATING THE SAME

CROSS-REFERENCE TO RELATED APPLICATIONS

This application is a continuation application of U.S. patent application No. 11/529,323 filed on Sep. 29, 2006, issued as U.S. Pat. No. 7,613,037 on Nov. 3, 2009, which is hereby incorporated by reference.

BACKGROUND OF THE INVENTION

1. Field of the Invention

The present invention generally relates to memory devices, and more particularly, the present invention relates to phase-change memory devices and to methods of fabricating the same.

A claim of priority is made to Korean Patent Application No. 10-2005-0098191 filed on Oct. 18, 2005 in the Korean Intellectual Property Office, the disclosure of which is incorporated herein by reference in its entirety.

2. Description of the Related Art

Phase-change random access memories (PRAMs) store data using a phase-change material, e.g., a chalcogenide alloy, which is responsive to temperature to be selectively programmed into a crystalline state or an amorphous state. The resistance of a crystalline phase-change material is relatively low when compared to an amorphous phase-change material is high. In conventional nomenclature, the crystalline state is referred to as a "set" state or "0" state, and the amorphous state is referred to as a "reset" state or "1" state.

A phase-change memory device includes a plurality of memory cells located at intersections of a plurality of bit lines and a plurality of word lines. Each phase-change memory cell has a phase-change material whose resistance varies depending on current flowing through it and an access device (e.g., a cell diode) which controls the current flowing through the phase-change material. The current causes temperature variations in the phase-change material to thereby program the memory cell in the set or reset states.

It is desirable that the phase-change material have a high endurance characteristic in which it maintains its phase-change properties even after being subjected to repeated read and/or write operations. In a conventional phase-change memory device, the phase-change material is independently formed for each phase-change memory cell by etching. However, the phase-change material is susceptible to defects since it is highly sensitive to etching. Any such defects can adversely impact the endurance of the phase-change material.

In addition, design rules have been reduced in an effort to manufacture large-capacity, highly integrated phase-change memory devices. However, processing complexities make it difficult to independently fabricate a phase-change material for each phase-change memory cell, particularly in highly integrated phase-change memory devices.

SUMMARY OF THE INVENTION

According to an aspect of the present invention, there is provided a phase-change memory device which includes a semiconductor substrate, a bit line and a word line arranged on the semiconductor substrate to intersect each other, and a phase-change material strip interposed between the bit line and the word line and extending lengthwise in a direction that is substantially parallel to at least a portion of the word line.

According to another aspect of the present invention, there is provided a phase-change memory device which includes a semiconductor substrate, a plurality of bit lines extending lengthwise on the semiconductor substrate in a first direction, a plurality of rows of cell diodes respectively located over and electrically connected to the plurality of bit lines, wherein each row of cell diodes extends in the first direction, a plurality of phase-change material strips extending lengthwise in a second direction over the plurality of rows of cell diodes, wherein each phase-change material strip is electrically connected to cell diodes of different rows among the plurality of rows of cell diodes, and a plurality of word lines respectively located over the plurality of phase-change material strips and extending lengthwise in the second direction.

According to still another aspect of the present invention, there is provided a method of fabricating a phase-change memory device, the method including forming a plurality of bit lines extending lengthwise on a semiconductor substrate in a first direction, forming a plurality of rows of cell diodes over the respective bit lines, wherein each row of cell diodes extends in the first direction, and forming a plurality of phase-change material strips and a plurality of word lines extending lengthwise in a second direction over the plurality of cell diodes.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

Figure 1:
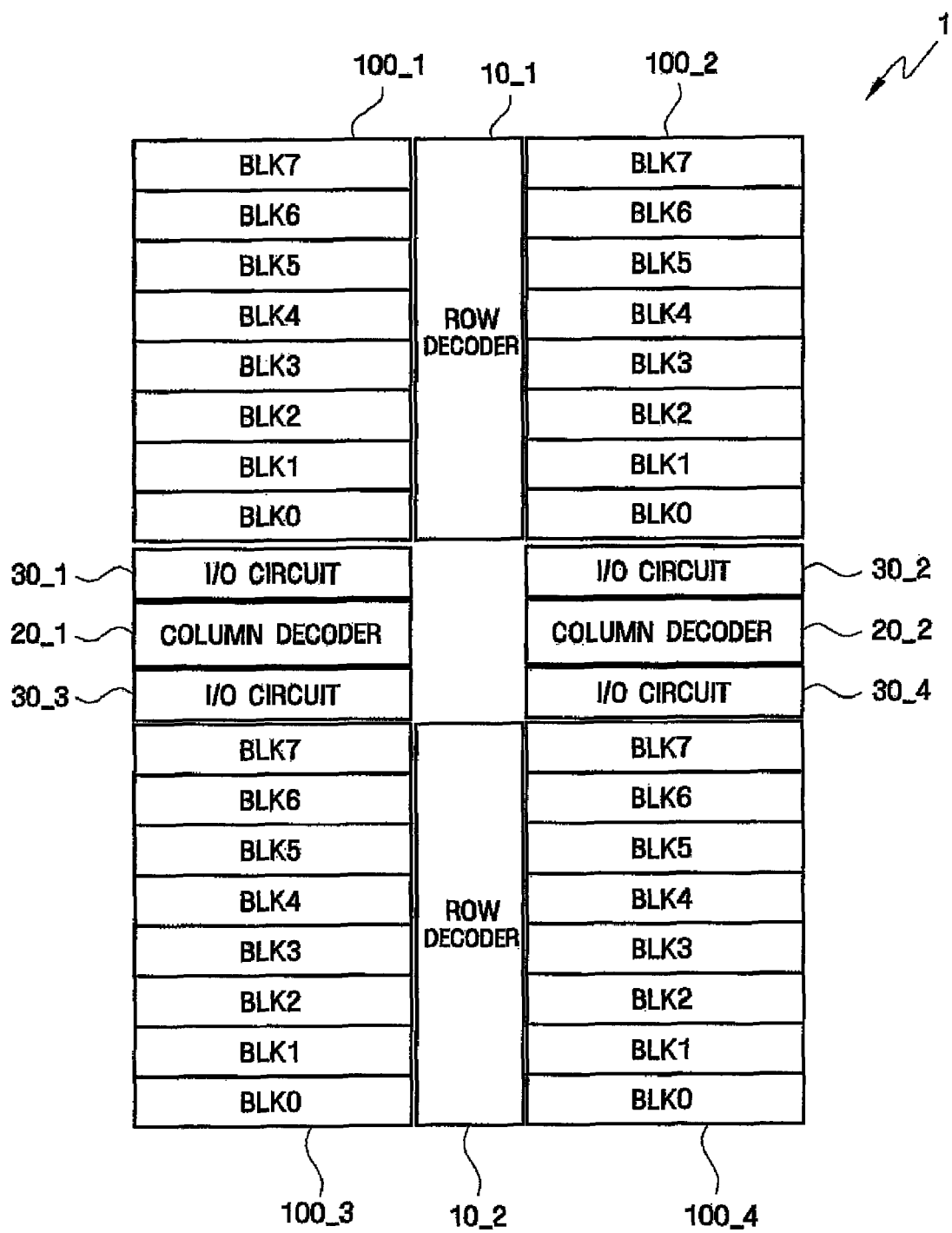
FIGS. 1 and 2 are a block diagram and a circuit diagram of a phase-change memory device according to an embodiment of the present invention, respectively.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that the term "and/or" as used herein refers to and encompasses any and all possible combinations of one or more of the associated listed items.

The present invention will now be described more fully with reference to the accompanying drawings, in which preferred but non-limiting embodiments of the invention are shown.

Figure 2:
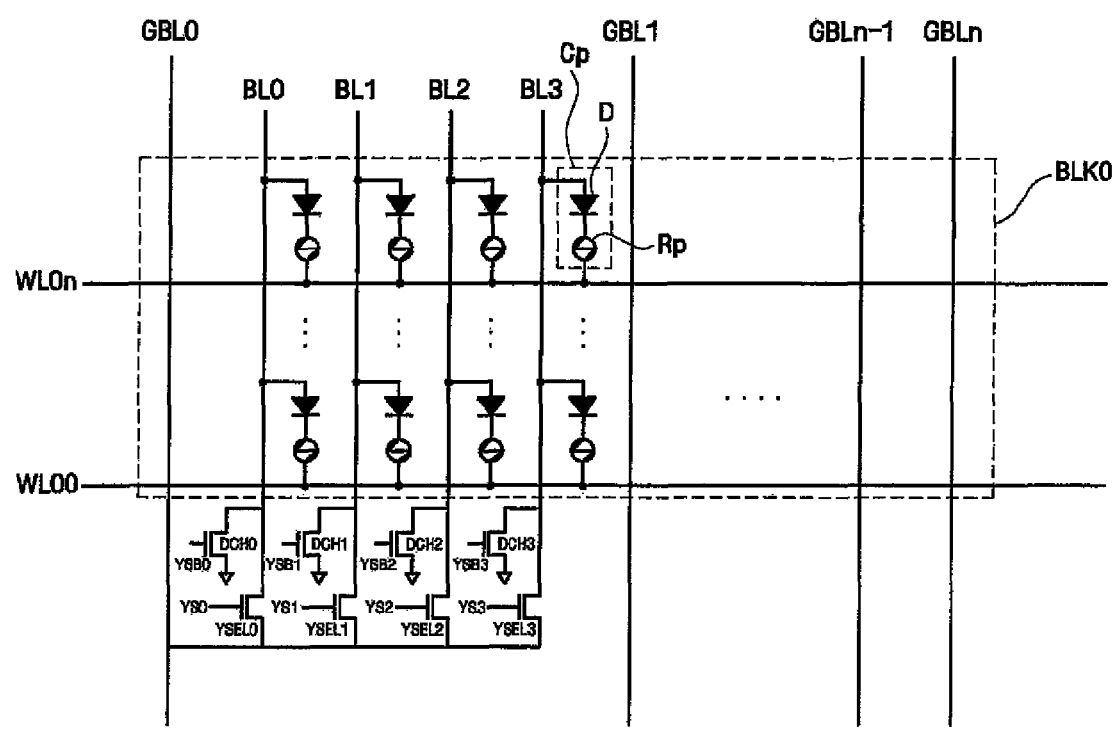

FIGS. 1 and 2 are a block diagram and a circuit diagram of a phase-change memory device according to an embodiment of the present invention, respectively. For convenience of explanation, a phase-change memory device 1 having four memory banks is described by way example. Also, for brevity, FIG. 2 shows a region related to a first memory block BLK0 of FIG. 2.

Referring first to FIG. 1, the phase-change memory device 1 includes first through fourth memory banks 100_1 through 100_4, row decoders 10_1 and 10_2, column decoders 20_1 and 20_2, and input/output (I/O) circuits 30_1 through 30_4.

Each of the memory banks 100_1 through 100_4 includes a plurality of phase-change memory cells arranged in a matrix array and a plurality of memory blocks BLKi, where i ranges from 0 to 7. While the illustrative embodiment of the present invention shows by way of example that each of the memory banks 100_1 through 100_4 includes 8 memory blocks BLKi, the invention is not limited thereto.

The row decoders 10_1 and 10_2 are arranged corresponding to two memory banks 100_1 and 100_2 or 100_3 and 100_4, respectively, to designate row addresses in the memory banks 100_1 through 100_4. For example, the row decoder 10_1 may select row addresses in the first and second memory banks 100_1 and 100_2.

The column decoders 20_1 and 20_2 are arranged corresponding to two memory banks 100_1 and 100_3 or 100_2 and 100_4, respectively, to designate column addresses in the first through fourth memory banks 100_1 through 100_4. For example, the column decoder 20_1 can select column addresses in the first and third memory banks 100_1 and 100_3.

The I/O circuits 30_1 through 30_4 are arranged corresponding to the respective memory banks 100_1 through 100_4, and write and/or read data to and/or from the appropriate memory banks 30_1 through 30_4. Although not shown in FIG. 1, each of the I/O circuits 30_1 through 30_4 may include a write circuit and/or a read circuit Referring to FIG. 2, the phase-change memory device 1 includes a memory block BLK0, a plurality of global bit lines GBLj, where j ranges from 0 to n, a plurality of bit lines BL0 through BL3, column select transistors YSELk, where k ranges from 0 to 3, and discharge transistors DCHk, where k ranges from 0 to 3.

The memory block BLK0 includes a plurality of phase-change memory cells Cp disposed at intersections of a plurality of word lines WL00-WL0n and the plurality of bit lines BL0 through BL3. In particular, the bit lines BL0 through BL3 may be connected to each of the plurality of global bit lines GBLj and branched to have a hierarchical bit line structure. More specifically, the plurality of global bit lines GBLj extend in one direction to be shared by the plurality of memory blocks (BLKi in FIG. 1). The plurality of bit lines BL0 through BL3 are selectively connected to each of the global bit lines GBLj through the column select transistors YSELk, while the plurality of phase-change memory cells Cp are coupled to each of the bit lines BL0 through BL3.

Each phase-change memory cell Cp includes a phase change material Rp and an access element D. The access element D selectively allows a current flow through the phase change material Rp, and the phase change material Rp is programmable between amorphous and crystalline states depending upon the current flowing there through. In this example, the phase-change material Rp is connected between each of the word lines WL00-WL0n and the access element D. Also in this example, the access element D is a cell diode having an anode coupled to a corresponding one of the bit lines BL0 through BL3 and a cathode coupled to the phase-change material Rp.

The column select transistors YSELk, where k ranges from 0 to 3, connect the global bit lines GBLj and the bit lines BL0 through BL3 in response to corresponding column select signals YSi, where i ranges from 0 to 3. Here, the column select signal YSi may be decoded signal from column address and block information.

Each of the discharge transistors DCHi, where i ranges from 0 to 3, is disposed between a corresponding one of the plurality of bit lines BL0 through BL3 and a ground voltage, and discharges a voltage applied the appropriate bit line in response to a corresponding one of complementary column select signals YSBi, where i ranges from 0 to 3, both before and after a write or read operation. Thus, the discharge transistors DCHi are turned on when the column select transistors YSELk are turned off.

An operation of the phase-change memory device 1 will now be described with reference to FIG. 2.

During a "reset" (logic "1") write operation of the phase-change memory device 10, the phase-change material Rp is heated above its melting temperature Tm by a current flowing through the phase-change material, and then rapidly cooled, so that it enters into the amorphous state.

On the other hand, during a "set" (logic "0") write operation of the phase-change memory device, the phase-change material Rp is heated to a temperature between its crystallization temperature Tx and melting temperature Tm, maintained at the same temperature for a predetermined period of time, and then cooled. This causes the phase-change material to enter into the crystalline state.

A considerably large amount of write current flows through the phase-change material Rp in order to induce a phase transition of the phase-change material Rp. For example, a "reset" write current of about 1 mA, and a "set" write current of about 0.6 to 0.7 mA may be applied. The write current is provided from a write circuit (not shown), passes through the global bit lines GBLj, the bit lines BL0 through BL3, the cell diodes D, and the phase-change materials Rp, and escapes through the word lines WL00-WL0n.

Meanwhile, during a read operation of the phase-change memory device 1, stored data is read from the phase-change memory cell Cp by providing current of a sufficiently low level so as to not induce a phase change to the phase-change material Rp. The read current is provided from a read circuit (not shown), passes through the global bit lines GBLj, the bit lines BL0 through BL3, the cell diodes D, and the phase-change materials Rp, and escapes through the word lines WL00-WL0n.

Figure 3A:
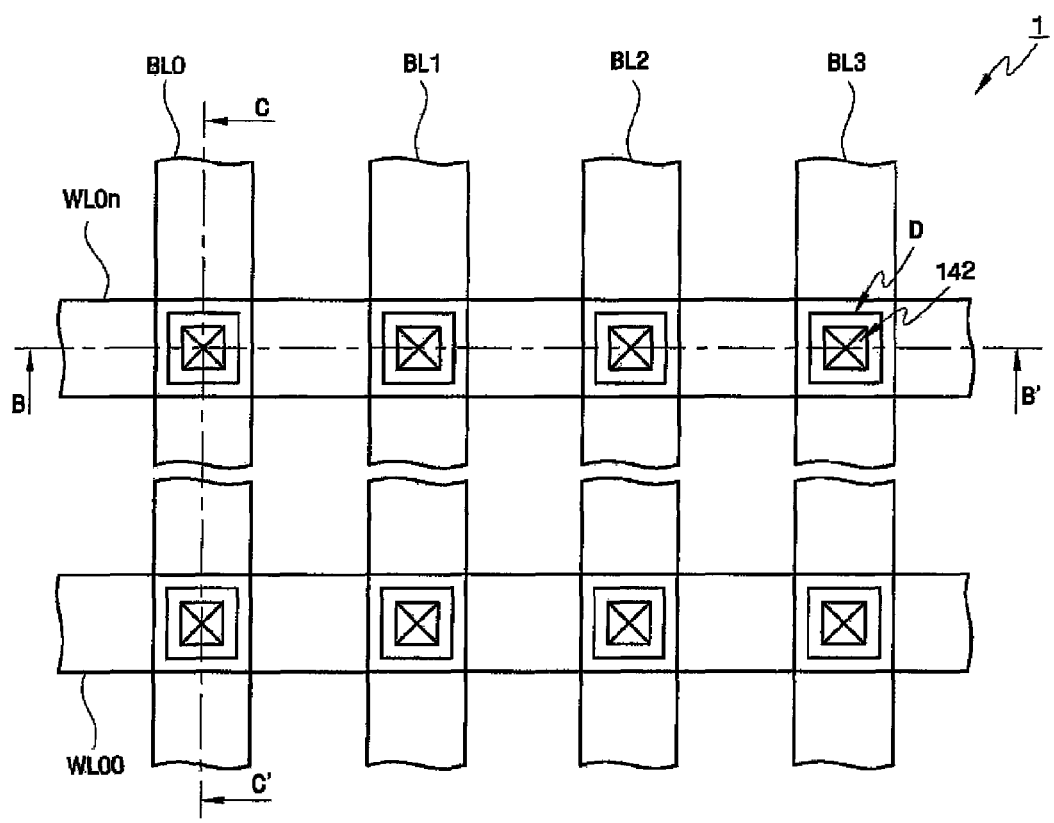
FIG. 3A is a layout view of a phase-change memory device according to an embodiment of the present invention.
Figure 3B:
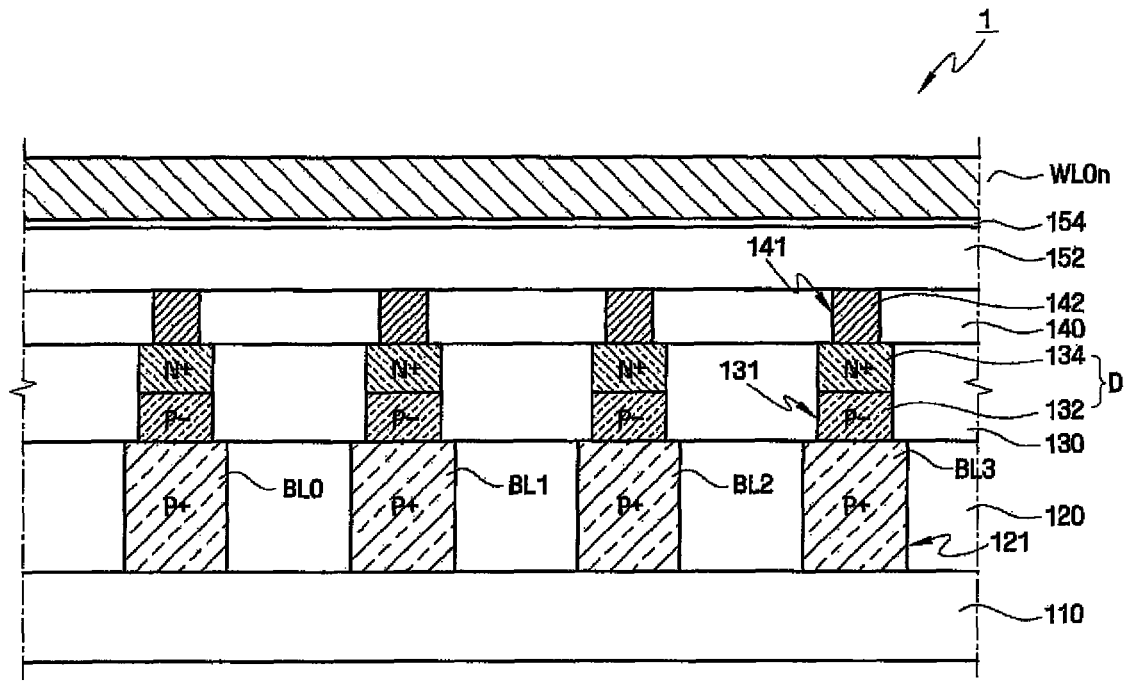
FIG. 3B is a cross-sectional view taken along the line B-B' of FIG. 3A.
Figure 3C:
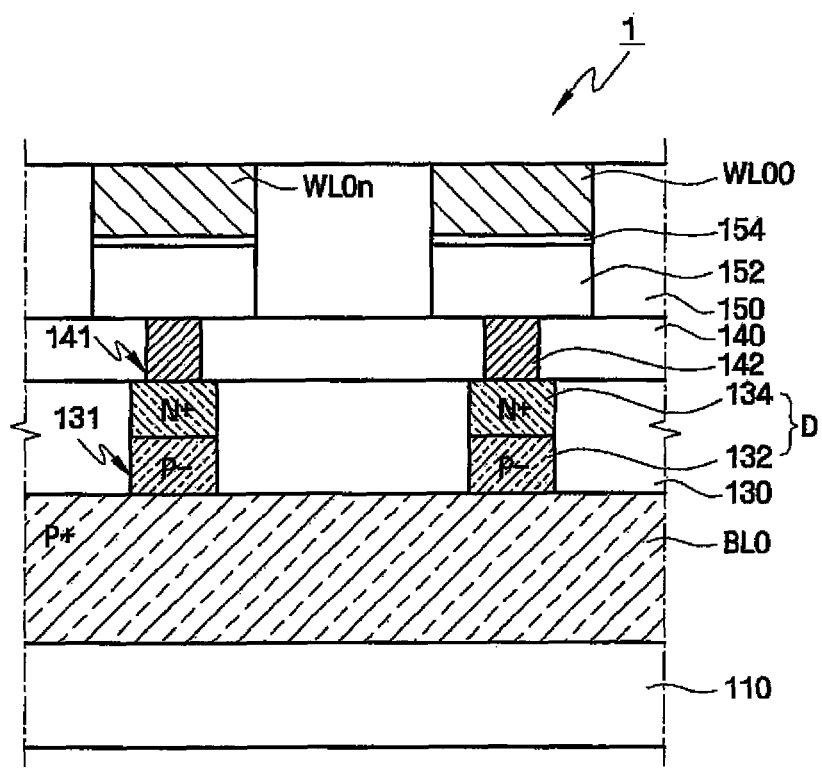
FIG. 3C is a cross-sectional view taken along the line C-C' of FIG. 3A.
Figure 3D:
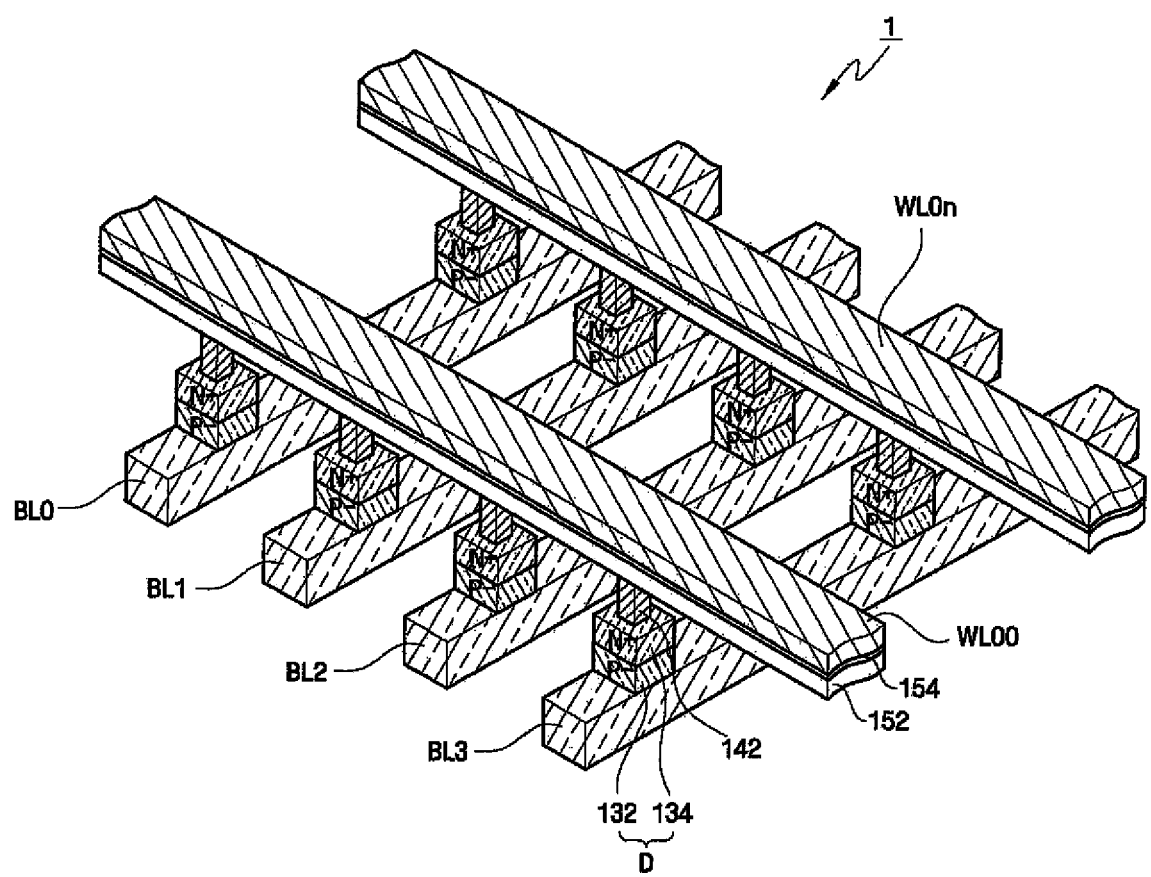
FIG. 3D is a perspective view of the phase-change memory device shown in FIG. 3A.

FIG. 3A is a layout view of a phase-change memory device according to an embodiment of the present invention, FIG. 3B is a cross-sectional view taken along the line B-B' of FIG. 3A, FIG. 3C is a cross-sectional view taken along the line C-C' of FIG. 3A, and FIG. 3D is a perspective view of the phase-change memory device shown in FIG. 3A. In these figures, an inter-layer dielectric layer, an inter-metal dielectric layer, or the like, are not shown to simplify the drawings. In addition, in contrast to the illustrations, the phase-change memory device according to embodiments of the present invention may have a bit-line-over-word-line structure.

Referring to FIGS. 3A through 3D, a bottom mold layer pattern 120 is disposed on a semiconductor substrate 110 of a first conductivity type (e.g., P-type) and has a plurality of openings 121 exposing the top surfaces of regions of the semiconductor substrate 110. Here, the semiconductor substrate 110 may be, for example, a silicon substrate, SOI (silicon on insulator), a Ga—As substrate, a Si—Ge substrate, a ceramic substrate, a quartz substrate, or a glass substrate for a display device.

In addition, the bottom mold layer pattern 120 may be a silicon oxide (SiOx), for example, a flowable oxide (FOX) layer, a torene silazene (TOSZ) layer, a undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, a high density plasma (HDP) layer, or the like.

The plurality of openings 121 in the bottom mold layer pattern 120 are filled with a plurality of bit lines BL0 through BL3. Since the plurality of openings 121 extend in a first direction, the bit lines BL0 through BL3 also extend in the first direction. Further, the plurality of bit lines BL0 through BL3 have the same conductivity type (e.g., P-type) as the semiconductor substrate 110. The impurity concentration of the bit lines BL0 through BL3 may be, but is not limited to, higher than $1*10^{19}$ atoms/cm$^3$. The plurality of bit lines BL0 through BL3 may be epitaxial layers. In this case, when the semiconductor substrate 10 is single crystalline, the plurality of bit lines BL0 through BL3 are also single crystalline.

A top mold pattern 130 with a plurality of openings 131 exposing the top surfaces of regions of the plurality of bit lines BL0 through BL3 is disposed on a the plurality of bit lines BL0 through BL3 and the bottom mold layer pattern 120. The top mold pattern 130 may be made of silicon oxide (SiOx) or other material. For example, the top mold pattern 130 may be made of silicon nitride such as SiN or SiON.

Each of the plurality of openings 131 in the top mold pattern 130 is filled with a first semiconductor pattern 132 of the first conductivity type (e.g., P-type) and a second semiconductor pattern 134 of a second conductivity type (e.g., N-type) overlying the first semiconductor pattern 132. More specifically, pairs of the first and second semiconductor patterns 132 and 134 are independently arranged on each of the plurality of bit lines BL0 through BL3 in the first direction (in which the bit lines BL0 through BL3 extend) according to the position of the plurality of openings 131.

The first and second semiconductor patterns 132 and 134 constitute a cell diode D. The plurality of first semiconductor patterns 132 may have a lower impurity concentration than the plurality of bit lines BL0 through BL3. The second semiconductor pattern 134 may have a higher impurity concentration than the first semiconductor pattern 132. This is to prevent leakage current flowing through a reversed biased cell diode. A reverse bias may be applied to a cell diode D in an unselected phase-change memory cell during a write or read operation.

The first and second semiconductor patterns 132 and 134 may be epitaxial patterns. In this case, like the bit lines BL0 through BL3, the first and second semiconductor patterns 132 and 134 may be single crystalline.

Although it has been described above that the plurality of openings 131 in the top mold pattern 130 are filled with the first and second semiconductor patterns 132 and 134, conductive plugs may be selectively added to the second semiconductor patterns 134 to fill the plurality of openings 131. The conductive plugs may be metal plugs having resistive contacts such as tungsten plugs.

An insulating layer pattern 140 having a plurality of contact holes 141 is formed on the plurality of cell diodes D and the top mold pattern 130. The insulating layer pattern 140 may be made of silicon oxide (SiOx). Each of the plurality of contact holes 141 is filled with a bottom electrode contact (BEC) 142. For example, the BEC 142 may be a TiN contact.

A plurality of phase-change material strips 152 are disposed on the plurality of BECs 142 and connects with the plurality of contact holes 141. The plurality of phase-change material strips 152 extend in a second direction to intersect the plurality of bit lines BL0 through BL3. That is, each phase-change material strip 152 is disposed for a plurality of phase-change memory cells arranged in the second direction.

The phase-change material forming the phase-change material strip 152 may be a binary (two-element) compound such as GaSb, InSb, InSe.Sb$_2$Te$_3$, or GeTe, a ternary (three-element) compound such as GeSbTe, GaSeTe, InSbTe, SnSb$_2$Te$_4$, or InSbGe, or a quaternary (four-element) compound such as AgInSbTe, (GeSn)SbTe, GeSb(SeTe), or Te$_{81}$Ge$_{15}$Sb$_2$S$_2$. The most commonly used phase-change material is GeSbTe.

A barrier layer 154 may be formed on the phase-change material strip 152. The barrier layer 154 prevents diffusion between phase-change materials of the phase-change material strips 152 and materials of word lines WL00-WL0$n$. The barrier layer 154 may be made of titanium (Ti)/titanium nitride (TiN).

The word lines WL00-WL0$n$ are disposed on the barrier layer 154 and extend adjacent and parallel to the phase-change material strips 152 so as to intersect the bit lines BL0 through BL3. For example, the word lines WL00-WL0$n$ may be formed of aluminum (Al) or tungsten (W).

In the example of FIG. 3D, the phase-change material strips 152 have the same width as and are aligned with the respective word lines WL00-WL0$n$. However, it will be apparent to those skilled in the art that the invention is not limited in his respect. For example, a portion of the phase-change material strip 152 can be parallel to each of the word lines WL00-WL0$n$, and/or a width of the phase-change material strips 152 may differ from that of the respective word lines WL00-WL0$n$.

Since the phase-change material strip 152 is utilized to provide a plurality of phase change memory cells, the phase-change material can be patterned in a line type. Thus, an etching process is simplified and highly precise etching can be achieved. As a result, stresses applied to the phase-change material are reduced which enhances the phase change characteristics even after repeated write and/or read operations, thus improving endurance.

In particular, during the write operation of the phase-change memory device 1, a considerably large amount of write current is provided to the phase-change material in order to induce a phase transition of the phase-change material. When the phase-change material strips 152 are adjacent and parallel to the word lines WL00-WL0$n$, more specifically, when the cell diodes D, the phase-change materials, and the word lines WL00-WL0$n$ are sequentially disposed on the bit lines BL0 through BL3 of the first conductivity type (P type), the stress of the phase-change materials can be reduced since a considerably high level of write current provided through the bit lines BL0 through BL3 flows into the phase-change materials through the cell diodes D.

Figure 4:
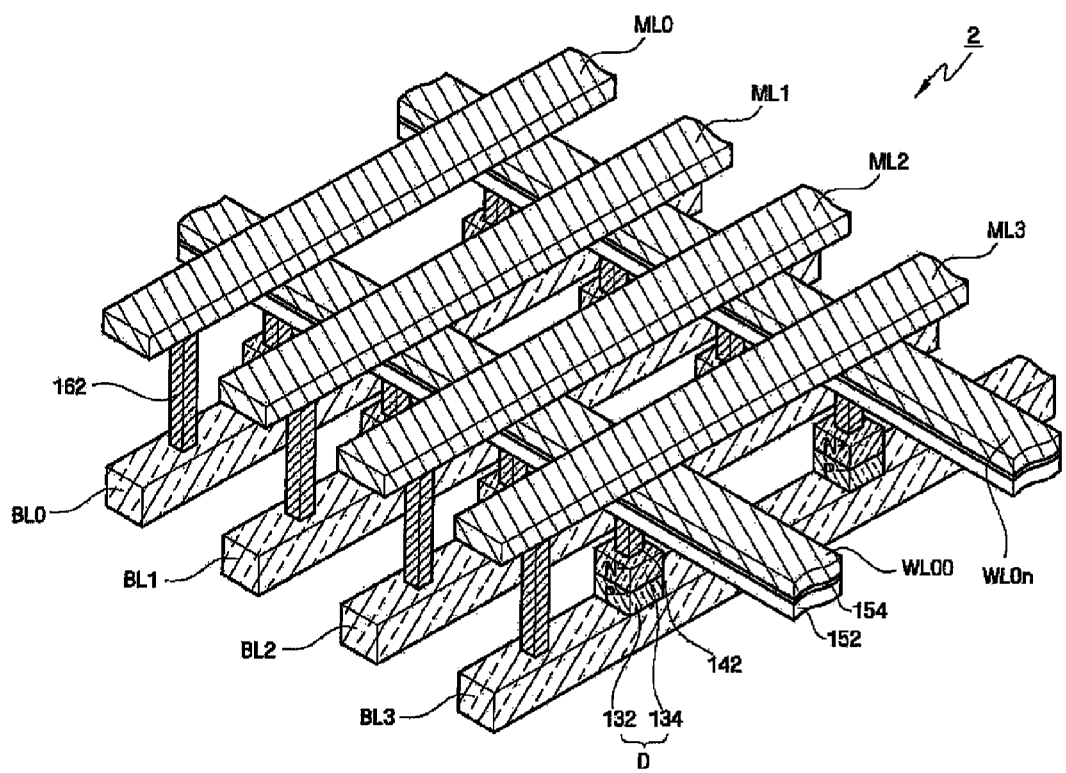
FIG. 4 is a perspective view of a phase-change memory device according to another embodiment of the present invention.

FIG. 4 is a perspective view of a phase-change memory device 2 according to another embodiment of the present invention. Similar or the same reference numerals are given to those components that are similar to or the same as the corresponding components shown in FIG. 3D and detailed explanations thereof are omitted to avoid redundancy.

Referring to FIG. 4, in contrast to the phase-change memory device 1 of the previous embodiment, the phase-change memory device 2 further includes a plurality of metal lines ML0 through ML3 that are disposed on a plurality of word lines WL00-WL0n and electrically connected to bit lines BL0 through BL3. The plurality of metal lines ML0 through ML3 may be substantially parallel to the plurality of bit lines BL0 through BL3.

The plurality of metal lines ML0 through ML3 can improve the characteristics of signals delivered through the bit lines BL0 through BL3. The phase-change memory device 2 uses epitaxial layers of the first conductivity type as the bit lines BL0 through BL3. As the integration density of the phase-change memory device 2 increases, the characteristics of signals sent through the bit lines BL0 through BL3 may be degraded. However, the presence of the metal lines ML0 through ML3 electrically connected to the respective bit lines BL0 through BL3 and having a lower resistance than the bit lines BL0 through BL3 can improve characteristics of signals because the signals can be delivered through the bit lines BL0 through BL3 and the metal lines ML0 through ML3.

Figure 5:
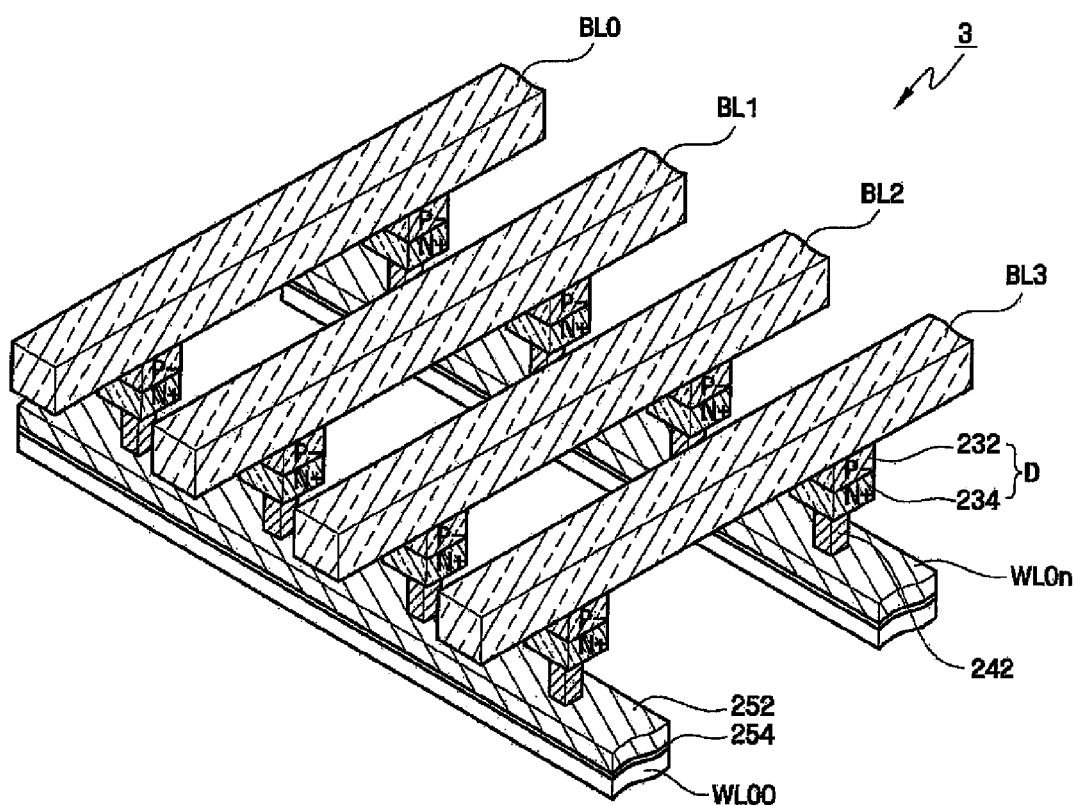
FIG. 5 is a perspective view of a phase-change memory device according to another embodiment of the present invention.

FIG. 5 is a perspective view of a phase-change memory device 3 according to another embodiment of the present invention.

Referring to FIG. 5, a plurality of bit lines BL0 through BL3 are disposed above a plurality of word lines WL00-WL0n.

In detail, the plurality of word lines WL00-WL0n extend in the second direction and barrier layers 254 are formed on the word lines WL00-WL0n.

A plurality of phase-change material strips 252 are formed on the barrier layers 254 and extend parallel to the plurality of word lines WL00-WL0n. That is, each of the plurality of phase-change material strips 252 is disposed for a plurality of phase-change memory cells arranged in the second direction. A plurality of electrode contacts 242 are arranged in the direction in which each phase-change material strip 252 extends. Separate cell diodes D are arranged on each electrode contact 242 and each cell diode D includes semiconductor patterns 232 and 234 of different conductivity types. The plurality of bit lines BL0 through BL3 are arranged on the plurality of cell diodes D and extend in the first direction to intersect the plurality of word lines WL00-WL0n.

FIGS. 6A through 8C are layout views and cross-sectional views for explaining a method of manufacturing a phase-change memory device according to an embodiment of the present invention.

The method of fabricating a phase-change memory device will now be described with reference to FIGS. 6A-8C and FIGS. 3A-3D.

Figure 6A:
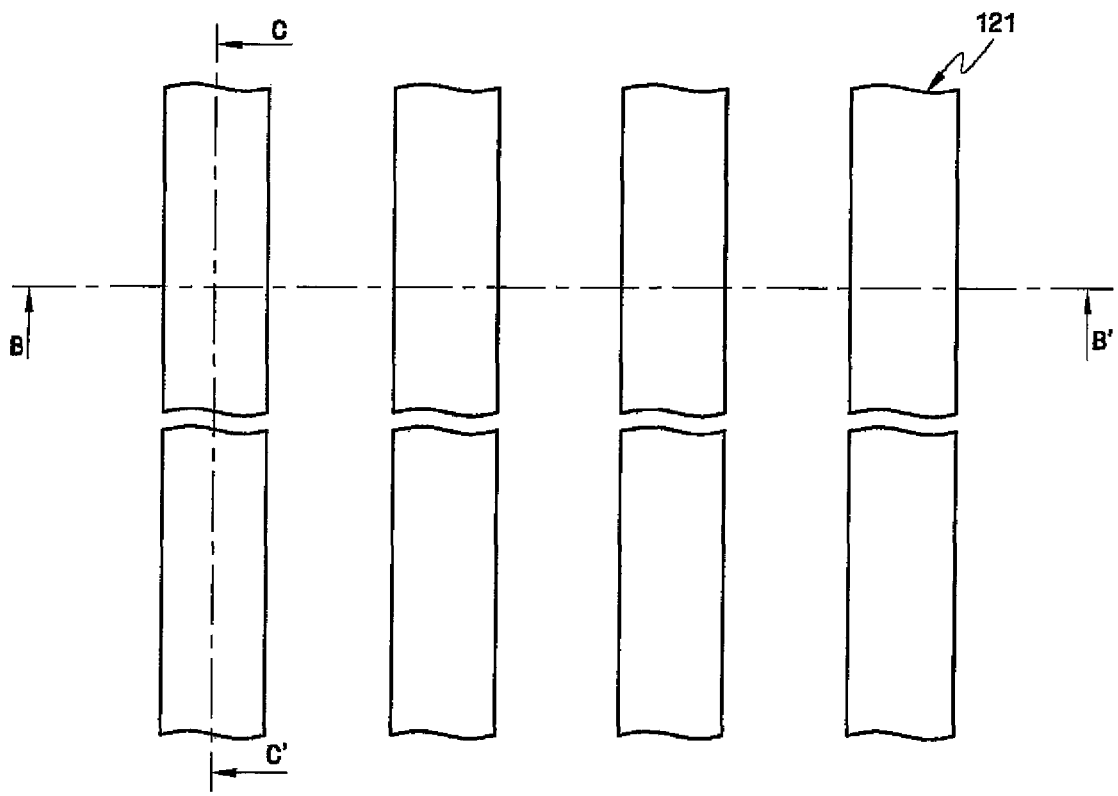
FIGS. 6A through 8C are layout views and cross-sectional views for explaining of a method of manufacturing a phase-change memory device according to another embodiment of the present invention.
Figure 6B:
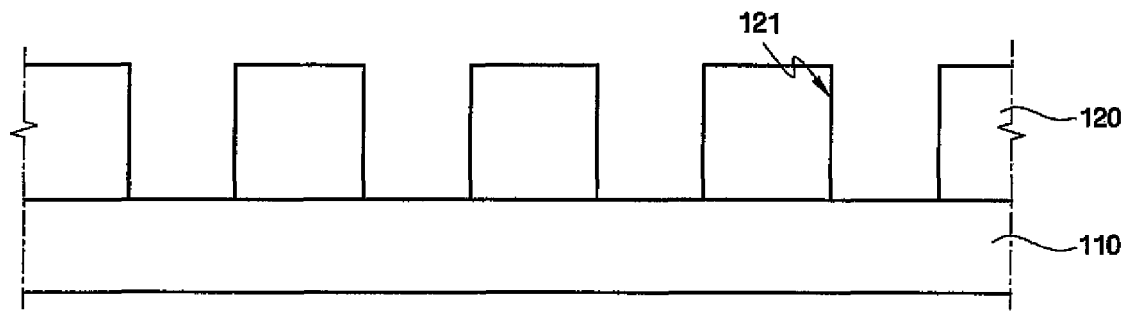
Figure 6C:
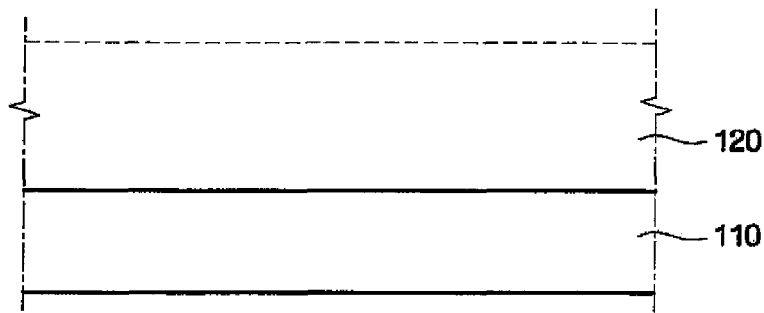

First, referring to FIGS. 6A-6C, a bottom mold layer pattern 120 having a plurality of openings 121 exposing the top surfaces of regions of a semiconductor substrate 110 and extending in a first direction is formed on the semiconductor substrate 110 of a first conductivity type (e.g., P-type).

Figure 7A:
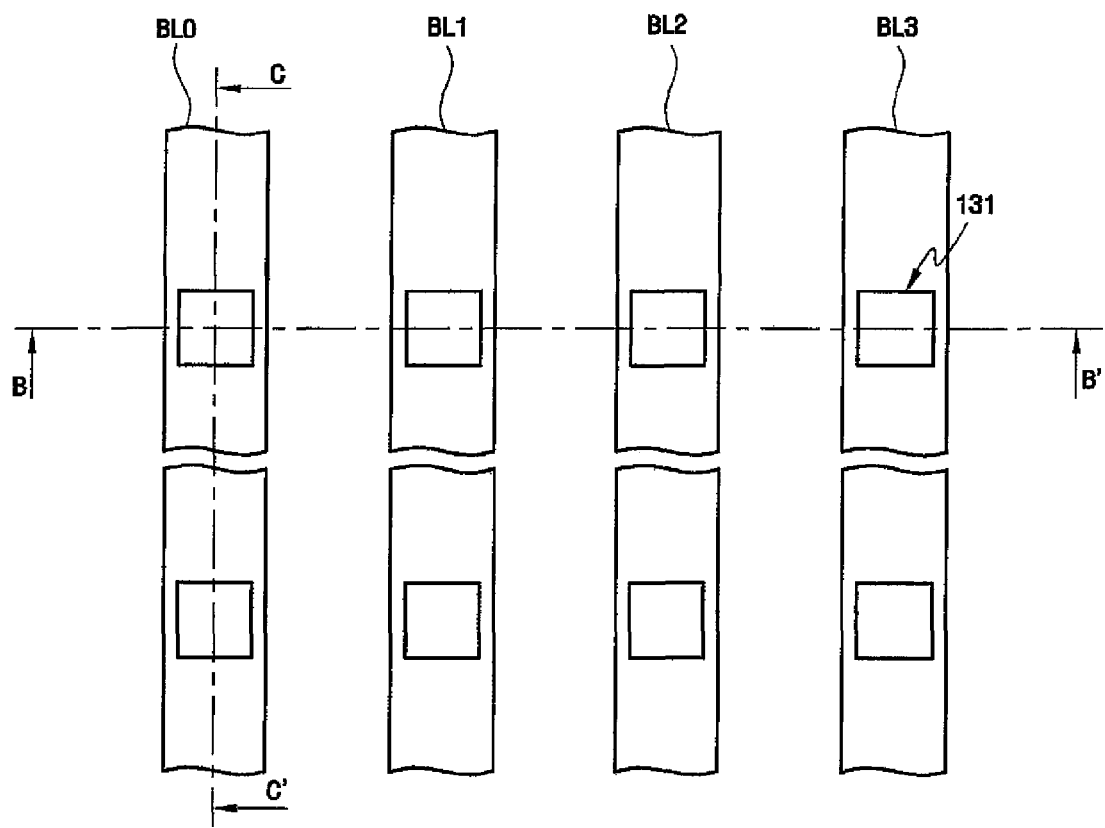
Figure 7B:
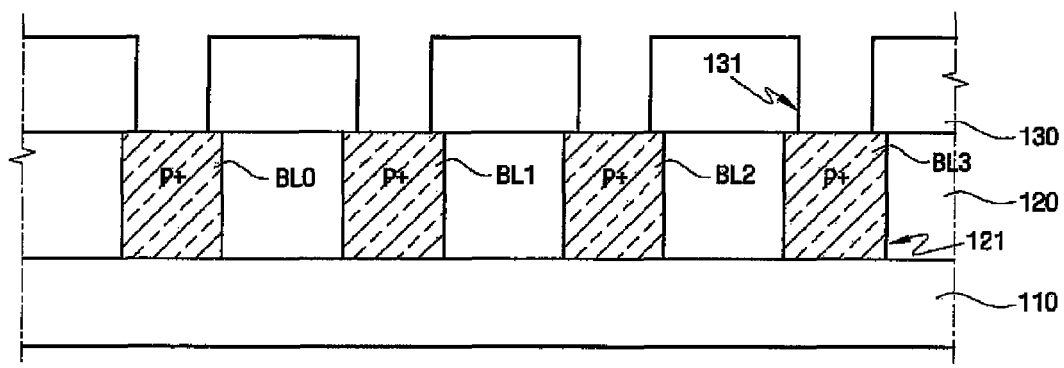
Figure 7C:
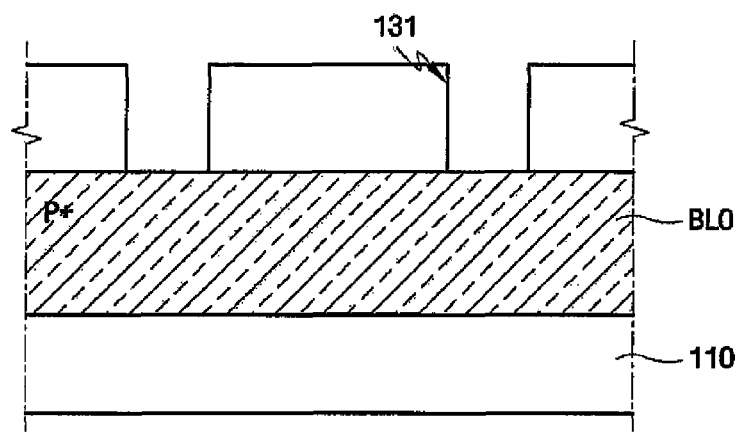

Referring to FIGS. 7A through 7C, a plurality of bit lines BL0 trough BL3 are formed to fill the plurality of openings 121 in the bottom mold layer pattern 120.

More specifically, the plurality of bit lines BL0 through BL3 can be grown by a selective epitaxial growth (SEG) process using the semiconductor substrate 110 exposed by the bottom mold layer pattern 120 as a seed layer. When the semiconductor substrate 110 is single crystalline, the plurality of grown epitaxial layers are also single crystalline.

Alternatively, for example, the plurality of bit lines BL0 through BL3 may be formed by a solid phase epitaxial (SPE) growth process. More specifically, a polycrystalline semiconductor layer or an amorphous semiconductor layer is formed to bury the plurality of openings 121 in the bottom mold layer pattern 120 and planarized to expose the top surface of the bottom mold layer pattern 120. Subsequently, grown polycrystalline or amorphous semiconductor layer is transformed into a single crystalline semiconductor layer by injecting ion beams at about 400° C.

As described above, when the plurality of bit lines BL0 through BL3 are formed using SEG or SPE processes, formation of voids or seams within the plurality of openings 121 can be largely prevented, thus reducing the resistance of the bit lines BL0 through BL3.

Next, impurities of the first conductivity type are ion-implanted into the entire surface of the semiconductor substrate 110 on which the epitaxial layers have been grown to complete the plurality of bit lines BL0 through BL3. The impurity concentration of the bit lines BL0 through BL3 may be, but is not limited to, higher than $1*10^{19}$ atoms/cm$^3$. When impurities are in-situ doped during a SEG or SPE growth process, ion implantation may be omitted.

Subsequently, a top mold pattern 130 with a plurality of openings 131 exposing the top surfaces of regions of the plurality of bit lines BL0 through BL3 is formed on a the plurality of bit lines BL0 through BL3 and the bottom mold layer pattern 120. The plurality of openings 131 in the top mold pattern 130 are arranged in the direction in which the plurality of bit lines BL0 through BL3 extend. Further, to prevent misalignment with the underlying bit lines BL0 through BL3, the openings 131 may have a width less than the plurality of bit lines BL0 through BL3.

Figure 8A:
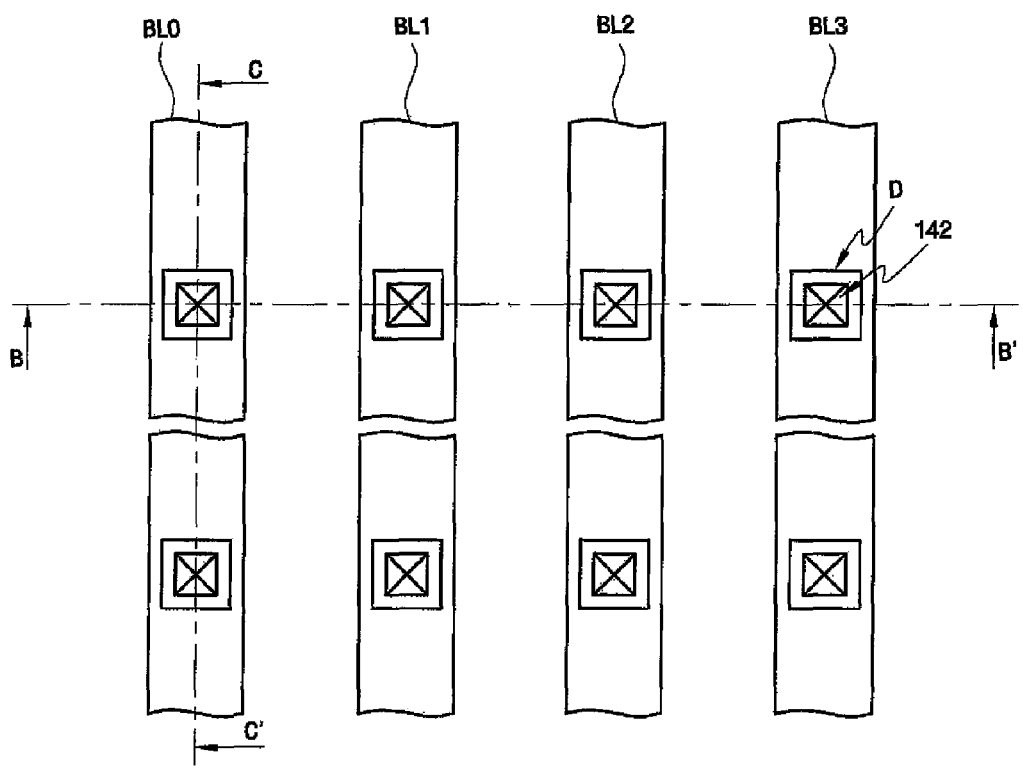
Figure 8B:
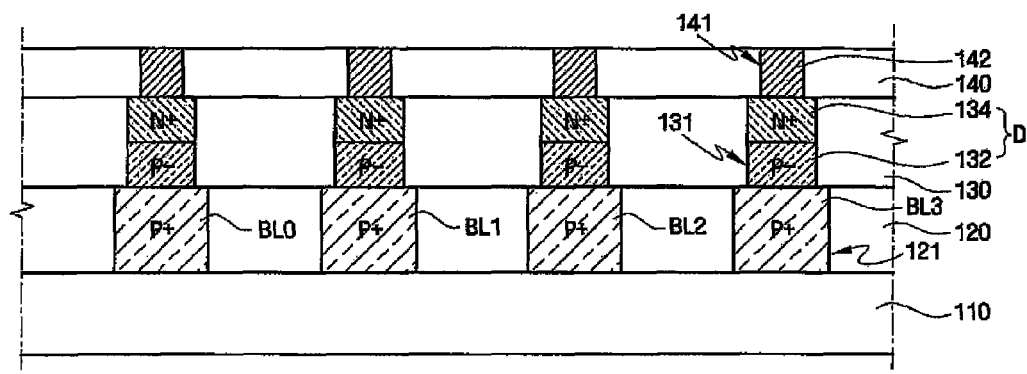
Figure 8C:
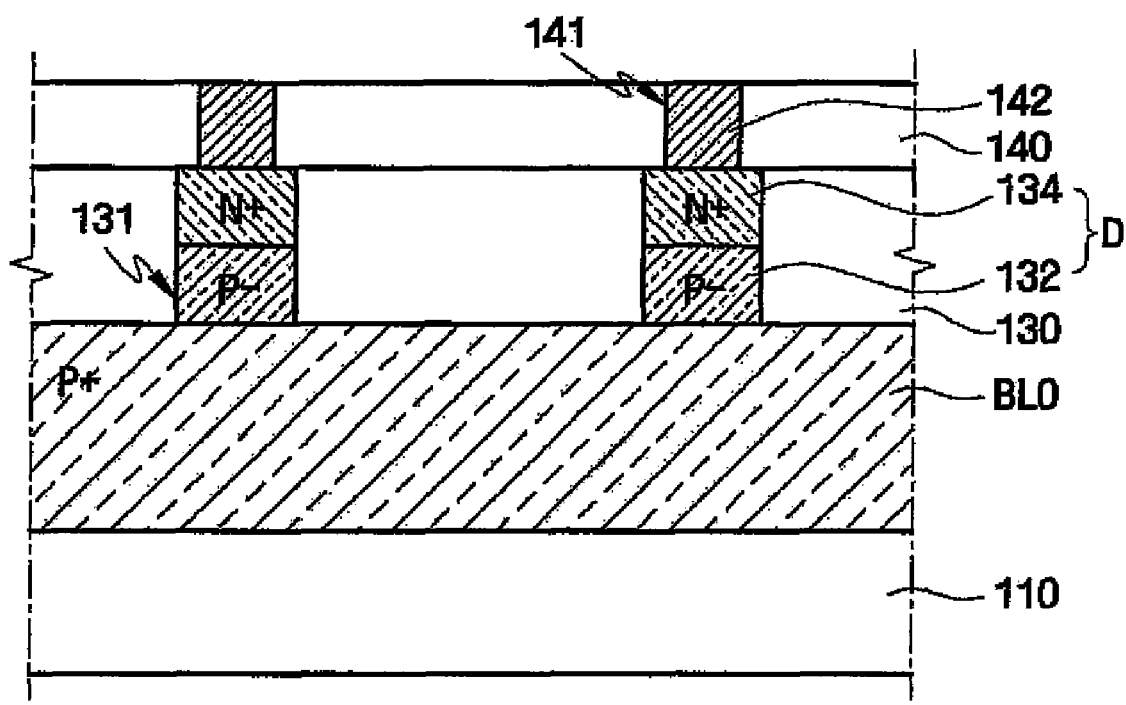

Referring to FIGS. 8A through 8C, the plurality of openings 131 are filled with first and second semiconductor patterns 132 and 134 to complete a plurality of cell diodes D.

More specifically, the first and second semiconductor patterns 132 and 134 may be grown by a SEG process. That is, the first and second semiconductor patterns 132 and 134 can be grown by using the bit lines BL0 through BL3 exposed by the top mold pattern 130 and the second semiconductor pattern 134 as seed layers. When the bit lines BL0 through BL3 are single crystalline, the first and second semiconductor patterns grown are also single crystalline. Alternatively, for example, the first and second semiconductor patterns 132 and 134 may be grown by a SPE growth process.

Then, impurities of first and second conductivity types are ion-implanted into the first and second semiconductor patterns 132 and 134, respectively. In this case, the first semiconductor patterns 132 may have a lower impurity concentration than the plurality of bit lines BL0 through BL3. The second semiconductor pattern 134 may have a higher impurity concentration than the first semiconductor pattern 132. When impurities are in-situ doped during a SEG or SPE growth process, ion implantation may be omitted.

Although not shown in the drawings, conductive plugs may be selectively formed on the second semiconductor patterns 134 to fill the plurality of openings 131 in the top mold pattern 130. In this case, the first and second semiconductor patterns 132 and 134 fill only lower regions of the plurality of openings 131 while the conductive plugs fill upper regions thereof.

Subsequently, an insulating layer pattern 140 having a plurality of contact holes 141 is formed on the plurality of cell diodes D and the top mold pattern 130, followed by formation of BECs burying the plurality of contact holes 141.

Turning to FIGS. 3A-3D, a phase-change material layer, a barrier material layer, a conductive layer for word lines are sequentially formed on the BECs 142 and the insulating layer pattern 140 and patterned to form the plurality of phase-change material strips 152, the plurality of barrier layers 154, and the plurality of word lines WL00-WL0n. The plurality of phase-change material strips 152 extend parallel to the plurality of word lines WL00-WL0n while intersecting the plurality of bit lines BL0 through BL3.

Since the phase-change material is patterned in a line type as described above, an etching process is simplified and highly precise etching can be achieved. Thus, the phase-change material is subjected to less stress which helps the material to maintain its characteristics even after repeated write and/or read operations, thereby improving endurance.

Again, in the above-description, the entire phase-change material strip 152 is parallel to each of the word lines WL00-WL0n, it will be apparent to those skilled in the art that a portion of the phase-change material strip 152 can be parallel to each of the word lines WL00-WL0n.

Example embodiments of the present invention have been disclosed herein and, although specific terms are employed, they are used and are to be interpreted in a generic and descriptive sense only and not for purpose of limitation. It will be understood by those of ordinary skill in the art that various changes in form and details may be made without departing from the spirit and scope of example embodiments of the present invention as set forth in the following claims.

What is claimed is:

1. A phase-change memory device comprising:
   a semiconductor substrate;
   a plurality of bit lines arranged on the semiconductor substrate;
   a plurality of word lines arranged on the semiconductor substrate, wherein each word line intersects each bit line; and
   a plurality of phase-change material strips positioned between the plurality of bit lines and the plurality of word lines wherein each phase-change material strip extends along a length of each word line or bit line.

2. The phase-change memory device of claim 1, wherein each phase-change material strip and each word line have the same width.

3. The phase-change memory device of claim 1, wherein each phase-change material strip is responsive to current to be programmable between at least two resistive states.

4. The phase-change memory device of claim 3, wherein the phase-change material strip includes germanium (Ge), antimony (Sb), and tellurium (Te).

5. The phase-change memory device of claim 3, further comprising:
   a plurality of access elements between the plurality of phase-change material strips and the plurality of bit lines respectively, controlling the current applied to the phase-change material strip.

6. The phase-change memory device of claim 1, wherein the plurality of word lines are disposed above the plurality of bit lines.

7. The phase-change memory device of claim 1, wherein the plurality of bit lines are disposed above the plurality of word lines.

8. A phase-change memory device comprising:
   a semiconductor substrate;
   a plurality of bit lines extending lengthwise on the semiconductor substrate in a first direction;
   a plurality of cell diodes respectively located over and electrically connected to the plurality of bit lines;
   a plurality of phase-change material strips extending lengthwise in the first direction or a second direction over the plurality of cell diodes; and
   a plurality of word lines respectively located over the plurality of phase-change material strips and extending lengthwise in the second direction,
   wherein each phase-change material strip overlaps at least two cell diodes.

9. The phase-change memory device of claim 8, wherein each phase-change material strip and each respective word line have a same width.

10. The phase-change memory device of claim 8, wherein the plurality of bit lines comprise epitaxial layers of a first conductivity type.

11. The phase-change memory device of claim 10, wherein each cell diode includes first semiconductor pattern of a first conductivity type and second semiconductor pattern of a second conductivity type overlying the first semiconductor pattern.

12. The phase-change memory device of claim 11, wherein the first conductivity type is a P-type and the second conductivity type is an N-type.

13. The phase-change memory device of claim 8, further comprising:
   a plurality of bottom electrode contacts on the plurality of cell diodes, electrically connecting the cell diodes with the respective phase-change material strips.

14. The phase-change memory device of claim 8, further comprising:
   a plurality of metal lines on the plurality of word lines, electrically connected to the plurality of bit lines, respectively.

15. The phase-change memory device of claim 14, wherein the plurality of metal lines extend in the first direction.

16. A method of fabricating a phase-change memory device, the method comprising:
   forming a plurality of bit lines extending lengthwise on a semiconductor substrate in a first direction;
   forming a plurality of cell diodes over the plurality of bit lines;
   forming a plurality of phase-change material strips over the plurality of cell diodes; and
   forming a plurality of word lines extending lengthwise in a second direction over the plurality of phase-change material strips,
   wherein each phase-change material strip extends along a length of each word line or each bit line and overlaps at least of two cell diodes.

17. The method of claim 16, wherein each phase-change material strip and each corresponding word line extend same direction and have a same width.

18. The method of claim 16, wherein the forming of the plurality of bit lines comprises forming bottom mold layer patterns having a plurality of openings on the semiconductor substrate, and forming epitaxial layers of a first conductivity type within the plurality of openings of the bottom mold layer patterns.

19. The method of claim 18, wherein the forming of the plurality of cell diodes comprises forming top mold layer patterns having a plurality of openings on the bottom mold layer patterns and the bit lines, and forming first semiconductor patterns of a first conductivity type and second semiconductor patterns of a second conductivity type within the plurality of openings of the top mold layer patterns, the second semiconductor patterns overlying the first semiconductor patterns.

20. The method of claim 16, further comprising:
forming a plurality of bottom electrode contacts on the plurality of cell diodes, after forming the plurality of cell diodes,
wherein each phase-change material strip electrically connects with the one cell diode of each row of the plurality of rows through a corresponding bottom electrode contact of the plurality of bottom electrode contacts.

* * * * *